United States Patent [19]
Eda

[11] Patent Number: 6,120,917
[45] Date of Patent: *Sep. 19, 2000

[54] HYBRID MAGNETIC SUBSTRATE AND METHOD FOR PRODUCING THE SAME

[75] Inventor: Kazuo Eda, Nara, Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/909,353

[22] Filed: Aug. 11, 1997

Related U.S. Application Data

[63] Continuation of application No. 08/349,802, Dec. 6, 1994, abandoned.

[30] Foreign Application Priority Data

Dec. 6, 1993 [JP] Japan ..................................... 5-305098

[51] Int. Cl.$^7$ ...................................................... H01F 10/26
[52] U.S. Cl. ........................... 428/692; 428/693; 156/60; 156/281; 156/306.3; 359/280; 385/6
[58] Field of Search ....................................... 428/692, 693; 156/281, 306.3, 60; 359/280; 385/6

[56] References Cited

U.S. PATENT DOCUMENTS

| | | |
|---|---|---|
| 2,268,365 | 12/1941 | Willard . |
| 2,907,680 | 10/1959 | Smith et al. ............................ 360/134 |
| 3,397,278 | 8/1968 | Pomerantz . |

(List continued on next page.)

FOREIGN PATENT DOCUMENTS

| | | |
|---|---|---|
| 0 192 850 | 9/1986 | European Pat. Off. . |
| 0 420 173 | 4/1991 | European Pat. Off. . |
| 0503892 | 9/1992 | European Pat. Off. . |

(List continued on next page.)

OTHER PUBLICATIONS

Kersten et al., "Multimode Integrated Optics Using Dielectric and Hollow Metallic Waveguides," 2319 Optics Communications, vol. 36, No. 1, pp. 25–30 (Jan. 1, 1981).

Maszara et al., "Bonding of silicon wafers for silicon–on–insulator," J. Appl. Phys. 64 (10), pp. 4943–4949 (Nov. 15, 1988).

P. Banes, "Phase Modulation of Light in Planar Electrooptical Waveguides," Siemens Forsch,– u. Entwicki.–Ber. Bd.5 (1976) Nr. 3 153–155.

Reed et al., "Silicon on insulator optical waveguides formed by direct wafer bonding," Materials Science and Engineering, vol. B15, No. 2, pp. 156–159 (Nov. 1, 1992).

Rod C. Alferness, "Waveguide Electrooptic Modulators," IEEE Transactions on Microwave Theory and Techniques, vol. MTT–30, No. 8, pp. 1121–1137 (Aug. 1982).

Ivan P. Kaminow, "Optical Waveguide Modulators," IEEE Transactions on Microwave Theory and Techniques, vol. MTT–23, No. 1, pp. 57–70 (Jan. 1975).

Murakami, M., et al., "Development of compact surface mounting tape quartz crystal resonator measuring 7.0 x 5.0 x 2.3 mm$^3$", *Nikkei Electronics*, No. 57, pp. 163–169, (Jul. 1, 1991).

(List continued on next page.)

*Primary Examiner*—John A. McPherson
*Attorney, Agent, or Firm*—Ratner & Prestia

[57] ABSTRACT

According to the present invention, a hybrid magnetic substrate is provided, which includes: a magnetic substrate; and a holding substrate directly bonded to the magnetic substrate through at least one of a hydrogen bond and a covalent bond. Furthermore, a method for producing a hybrid magnetic substrate having the magnetic substrate and the holding substrate is provided, which includes the steps of: cleaning a surface of the magnetic substrate to be bonded and a surface of the holding substrate to be bonded; allowing the cleaned surfaces to be subjected to a hydrophilic treatment; and attaching the surfaces, which are subjected to the hydrophilic treatment, to each other to directly bond the magnetic substrate to the holding substrate.

28 Claims, 13 Drawing Sheets

U.S. PATENT DOCUMENTS

| | | |
|---|---|---|
| 4,009,516 | 3/1977 | Chiang et al. . |
| 4,092,060 | 5/1978 | Nunoshita et al. . |
| 4,191,905 | 3/1980 | Yasuda et al. . |
| 4,266,156 | 5/1981 | Kizaki . |
| 4,270,105 | 5/1981 | Parker et al. . |
| 4,293,986 | 10/1981 | Kobayashi et al. . |
| 4,362,961 | 12/1982 | Gerber . |
| 4,403,825 | 9/1983 | Tangonan et al. . |
| 4,464,598 | 8/1984 | Besson et al. . |
| 4,479,070 | 10/1984 | Frische et al. . |
| 4,582,390 | 4/1986 | Furuya . |
| 4,633,122 | 12/1986 | Radice . |
| 4,639,631 | 1/1987 | Chason et al. . |
| 4,665,374 | 5/1987 | Fathimulla . |
| 4,698,820 | 10/1987 | Brandle, Jr. et al. ...................... 372/41 |
| 4,772,787 | 9/1988 | Trommer . |
| 4,851,025 | 7/1989 | Siefert et al. . |
| 4,967,466 | 11/1990 | Takeya et al. ............................ 29/603 |
| 4,983,251 | 1/1991 | Haisma et al. .......................... 156/630 |
| 5,070,488 | 12/1991 | Fukushima et al. . |
| 5,075,641 | 12/1991 | Weber et al. . |
| 5,113,469 | 5/1992 | Hatakoshi et al. . |
| 5,125,065 | 6/1992 | Stoll et al. . |
| 5,157,748 | 10/1992 | Mueller et al. . |
| 5,166,646 | 11/1992 | Avanic et al. . |
| 5,185,830 | 2/1993 | Nishimoto . |
| 5,281,305 | 1/1994 | Lee et al. . |
| 5,302,879 | 4/1994 | Totty et al. . |
| 5,304,887 | 4/1994 | Heinecke et al. . |
| 5,319,324 | 6/1994 | Satoh et al. . |
| 5,417,804 | 5/1995 | Nishihara et al. . |
| 5,483,115 | 1/1996 | Haisma .................................. 310/156 |
| 5,485,540 | 1/1996 | Eda . |

FOREIGN PATENT DOCUMENTS

| | | |
|---|---|---|
| 0531985 | 3/1993 | European Pat. Off. . |
| 0575948 | 12/1993 | European Pat. Off. . |
| 2 547 458 | 12/1984 | France . |
| 2701200 | 7/1977 | Germany . |
| 3922671 | 1/1991 | Germany . |
| 4404931 | 8/1994 | Germany . |
| 52-23355 | 2/1977 | Japan . |
| 54-51792 | 4/1979 | Japan . |
| 55-64414 | 5/1980 | Japan . |
| 56-131219 | 10/1981 | Japan . |
| 59-67710 | 4/1984 | Japan . |
| 62-27040 | 6/1987 | Japan . |
| 63-261219 | 10/1988 | Japan . |
| 63-285195 | 11/1988 | Japan . |
| 1-211217 | 8/1989 | Japan . |
| 2-232606 | 9/1990 | Japan . |
| 3035203 | 2/1991 | Japan . |
| 3075608 | 3/1991 | Japan . |
| 3-178206 | 8/1991 | Japan . |
| 4-283957 | 10/1992 | Japan . |
| 4-313211 | 11/1992 | Japan . |
| 705642 | 12/1984 | U.S.S.R. . |
| 2 191 603 | 12/1987 | United Kingdom . |
| 2202989 | 10/1988 | United Kingdom . |

OTHER PUBLICATIONS

Kittel, C., "3 crystal binding", *Introduction to Solid State Physics*, fifth edition, pp. 92–97 (1976).

J. Haisma et al., "Silicon–on–Insulator Wafer Bonding–Wafer Thinning Technological Evaluations", *Japanese Journal of Applied Physics*, vol. 28, No. 8, pp. 1426–1443 (Aug. 1989).

J.P. Castera, "State of the Art in Design and Technology of MSW Devices (invited)", *Journal of Applied Physics*, 55(6), pp. 2506–2511 (1984).

K. Matsumoto et al., "Preparation of Bi–Substituted YIG Garnets by Sol–Gel Synthesis and Their Magnetic Properties", *IEEE Translation Journal of Magnetics in Japan*, vol. 6, No. 1, pp. 15–22 (Jan. 1991).

M. Totoki et al., "Demonstration of Direct Bonding Between INP and Gadolinium Gallium Garnet ($GD_3Ga_5O_{12}$) Substrates", *Electronics Letters*, vol. 30, No. 18, pp. 1534–1536 (Sep. 1994).

HYBRID MAGNETIC SUBSTRATE AND METHOD FOR PRODUCING THE SAME

This application is a continuation of application Ser. No. 08/349,802 filed Dec. 6, 1994, now abandoned.

BACKGROUND OF THE INVENTION

1. Field of the Invention

The present invention relates to a hybrid magnetic substrate and a method for producing the same. In particular, the present invention relates to a hybrid magnetic substrate in which a magnetic substrate is bonded to a holding substrate through direct bonding and a method for producing the same.

2. Description of the Related Art

As devices utilizing a magnetic, there are optical isolators allowing light to pass only in a predetermined direction by using a magneto-optic effect and various kinds of magnetostatic wave devices using a magnetostatic wave propagating through a magnetic. In most cases, these devices utilize a magnetic as a magnetic substrate layered on another substrate or as a thin film formed on another substrate. In the present specification, an entire substrate composed of a substrate and a magnetic substrate or magnetic film layered on the substrate is referred to as a hybrid magnetic substrate.

For example, Japanese Laid-Open Patent Publication No. 2-232606 discloses a thin film wave guiding type optical isolator having, on a garnet single crystalline substrate, a garnet type thin film as an intermediate layer and another garnet type thin film as a waveguide layer made of a magneto-optic material. This construction is formed by a liquid phase epitaxial method.

FIG. 1 shows a construction of a conventional optical isolator 201. In this figure, a substrate 101 is made of, for example, a gadolinium-gallium-garnet (GGG) single crystal. The intermediate layer 104 is formed by a liquid phase epitaxial method. As the intermediate layer 104, yttrium-iron-garnet (YIG) type materials are used. An optical waveguide layer 102 is formed on the intermediate layer 104 by a liquid phase epitaxial method. As the optical waveguide layer 102, YIG type materials are also used. On the optical waveguide layer 102, an upper layer 103 is formed. As a material for the upper layer 103, ZnO is used, for example. The upper layer 103 is not indispensable. Instead of forming the upper layer 103, the upper face of the optical waveguide layer 102 may be exposed.

Light is confined in the optical waveguide layer 102 by providing the intermediate layer 104 having a refractive index smaller than that of the optical waveguide layer 102. Furthermore, the optical waveguide layer 102 is made of a YIG type material having a magneto-optic effect, so that it works as an optical isolator.

Regarding magnetostatic wave devices, for example, J. Castera (Journal of Applied Physics, 55(6), pp. 2506–2511, 1984) discloses a method for producing a magnetostatic wave device and various applications of the magnetostatic wave device. This publication describes a method for forming a thin film made of YIG on a GGG substrate by a liquid phase epitaxial method, and exemplifies filters, oscillators, delay lines, etc. as the applications of the magnetostatic wave device.

The above-mentioned conventional examples have the following problems:

In a method for forming a hybrid magnetic substrate by various kinds of epitaxial growth methods, only a film with a lattice constant matching with that of a substrate can be formed, so that the combination of the materials for the film and the substrate is limited. The crystal orientation of the film to be formed depends upon that of the substrate, which decreases the degree of freedom of forming a film having a preferred crystal orientation. Furthermore, even though any of the epitaxial growth methods such as liquid phase epitaxial growth, chemical vapor phase epitaxial growth, and molecular beam epitaxial growth is used, it has been difficult to obtain a magnetic film having characteristics superior to those of a bulk single crystal.

For layering substrates made of different materials, methods for fixing them with various kinds of adhesives can be used. However, according to the conventional methods using adhesives, the precision of thickness of interface layers bonding the respective layers to each other, heat resistance, chemical resistance, and reliability are not sufficient.

SUMMARY OF THE INVENTION

The hybrid magnetic substrate of this invention, includes: a magnetic substrate; and a holding substrate directly bonded to the magnetic substrate through at least one of a hydrogen bond and a covalent bond.

In one embodiment of the invention, a thickness of a bonding interface layer between the magnetic substrate and the holding substrate directly bonded to each other is 20 nm or less.

In another embodiment of the invention, a material for the magnetic substrate is a single crystal.

In still another embodiment of the invention, a material for the magnetic substrate is garnet.

In still another embodiment of the invention, a material for the magnetic substrate is mainly yttrium-iron-garnet.

In still another embodiment of the invention, the holding substrate is made of a semiconductor material.

In still another embodiment of the invention, the semiconductor material is silicon.

In still another embodiment of the invention, the semiconductor material is a III–V group semiconductor material.

In still another embodiment of the invention, a material for the holding substrate is glass.

In still another embodiment of the invention, a thermal expansion coefficient of the glass is substantially the same as a thermal expansion coefficient of the magnetic substrate.

In still another embodiment of the invention, the holding substrate is a light-transmitting substrate having an electro-optic effect.

In still another embodiment of the invention, a material for the holding substrate is a magnetic.

In still another embodiment of the invention, a material for the magnetic substrate is the same as a material for the holding substrate.

Alternatively, a hybrid magnetic substrate of this invention includes a magnetic substrate and a holding substrate, wherein at least one of the magnetic substrate and the holding substrate has an inorganic thin film on its surface, and the magnetic substrate and the holding substrate are directly bonded to each other through at least one of a hydrogen bond and a covalent bond.

In one embodiment of the invention, a thickness of a bonding interface layer between the magnetic substrate and the holding substrate directly bonded to each other is 20 nm or less.

In another embodiment of the invention, a material for the magnetic substrate is a single crystal.

In still another embodiment of the invention, a material for the magnetic substrate is garnet.

In still another embodiment of the invention, a material for the magnetic substrate is mainly yttrium-iron-garnet.

In still another embodiment of the invention, the holding substrate is made of a semiconductor material. still another embodiment of the invention, the semiconductor material is silicon.

In still another embodiment of the invention, the semiconductor material is a III–V group semiconductor material.

In still another embodiment of the invention, a material for the holding substrate is glass.

In still another embodiment of the invention, a thermal expansion coefficient of the glass is substantially the same as a thermal expansion coefficient of the magnetic substrate.

In still another embodiment of the invention, the holding substrate is a light-transmitting substrate having an electro-optic effect.

In still another embodiment of the invention, a material for the holding substrate is a magnetic.

In still another embodiment of the invention, a material for the magnetic substrate is the same as a material for the holding substrate.

In still another embodiment of the invention, a material for the inorganic thin film is selected from the group consisting of silicon and a silicon compound.

In still another embodiment of the invention, the silicon compound is selected from silicon oxide and silicon nitride. to another aspect of the invention, a method for producing a hybrid magnetic substrate having a magnetic substrate and a holding substrate, includes the steps of:

cleaning a surface of the magnetic substrate to be bonded and a surface of the holding substrate to be bonded;

allowing the cleaned surfaces to be subjected to a hydrophilic treatment; and attaching the surfaces, which are subjected to the hydrophilic treatment, to each other to directly bond the magnetic substrate to the holding substrate.

Alternatively, a method of the invention for producing a hybrid magnetic substrate having a magnetic substrate and a holding substrate, includes the steps of:

forming an inorganic thin film on at least one surface to be bonded of the magnetic substrate and the holding substrate;

cleaning a surface of the inorganic thin film and the surface to be bonded on which the inorganic thin film is not formed;

allowing the cleaned surface of the inorganic thin film and the surface to be bonded on which the inorganic thin film is not formed to be subjected to a hydrophilic treatment; and attaching the surfaces, which are subjected to the hydrophilic treatment, to each other to directly bond the magnetic substrate to the holding substrate.

In one embodiment of the invention, a material for the inorganic thin film is selected from the group consisting of silicon and a silicon compound.

According to still another aspect of the invention, a magnetostatic wave device includes a hybrid magnetic substrate having a magnetic substrate and a holding substrate directly bonded to the magnetic substrate through at least one of a hydrogen bond and a covalent bond, wherein an electrode for exciting a magnetostatic wave is provided on the magnetic substrate.

Alternatively, a magnetostatic wave device of the invention includes a hybrid magnetic substrate having a magnetic substrate and a holding substrate, at least one of the magnetic substrate and the holding substrate having an inorganic thin film on its surface, the magnetic substrate and the holding substrate being directly bonded to each other through at least one of a hydrogen bond and a covalent bond via the inorganic thin film, wherein an electrode for exciting a magnetostatic wave is provided on the magnetic substrate.

Alternatively, a magnetic device of the invention includes a hybrid magnetic substrate having a magnetic substrate and a holding substrate directly bonded to the magnetic substrate through at least one of a hydrogen bond and a covalent bond, wherein the magnetic substrate has a magneto-optic effect and an optical waveguide is formed on the magnetic substrate.

Alternatively, a magnetic device of the invention includes a hybrid magnetic substrate having a magnetic substrate and a holding substrate directly bonded to the magnetic substrate through at least one of a hydrogen bond and a covalent bond, wherein the magnetic substrate has a magneto-optic effect and the magnetic substrate has a function as an optical isolator.

Alternatively, a magnetic device of the invention includes a hybrid magnetic substrate having a magnetic substrate and a holding substrate, at least one of the magnetic substrate and the holding substrate having an inorganic thin film on its surface, the magnetic substrate and the holding substrate being directly bonded to each other through at least one of a hydrogen bond and a covalent bond via the inorganic thin film, wherein the magnetic substrate has a magnet-optic effect and the magnetic substrate has a function as an optical isolator.

Alternatively, a magnetic device of the invention includes a hybrid magnetic substrate having a magnetic substrate and a holding substrate directly bonded to the magnetic substrate through at least one of a hydrogen bond and a covalent bond, wherein the holding substrate is a light-transmitting substrate having an electro-optic effect and an optical device is formed on the light-transmitting substrate.

Alternatively, a magnetic device of the invention includes a hybrid magnetic substrate having a magnetic substrate and a holding substrate, at least one of the magnetic substrate and the holding substrate having an inorganic thin film on its surface, the magnetic substrate and the holding substrate being directly bonded to each other through at least one of a hydrogen bond and a covalent bond via the inorganic thin film, wherein the holding substrate is a light-transmitting substrate having an electro-optic effect, and an optical device is formed on the light-transmitting substrate.

According to still another aspect of the invention, an integrated magnetic device includes a hybrid magnetic substrate having a magnetic substrate and a holding substrate directly bonded to the magnetic substrate through at least one of a hydrogen bond and a covalent bond, wherein the holding substrate is made of a semiconductor material and at least one element selected from the group consisting of an electronic element and an optical element is formed on the holding substrate.

Alternatively, an integrated magnetic device of the invention includes a hybrid magnetic substrate having a magnetic substrate and a holding substrate, at least one of the magnetic substrate and the holding substrate having an inorganic thin film on its surface, the magnetic substrate and the holding substrate being directly bonded to each other through at least one of a hydrogen bond and a covalent bond via the inorganic thin film, wherein the holding substrate is made of a semiconductor material and at least one element selected from the group consisting of an electronic element and an optical element is formed on the holding substrate.

Thus, the invention described herein makes possible the advantage of providing a thermally, mechanically, and chemically stable hybrid magnetic substrate which has a large degree of freedom of the combination of materials for the substrates and which is capable of being finely processed, and a method for producing the same.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the drawings.

EXAMPLE 1

Figure 1:
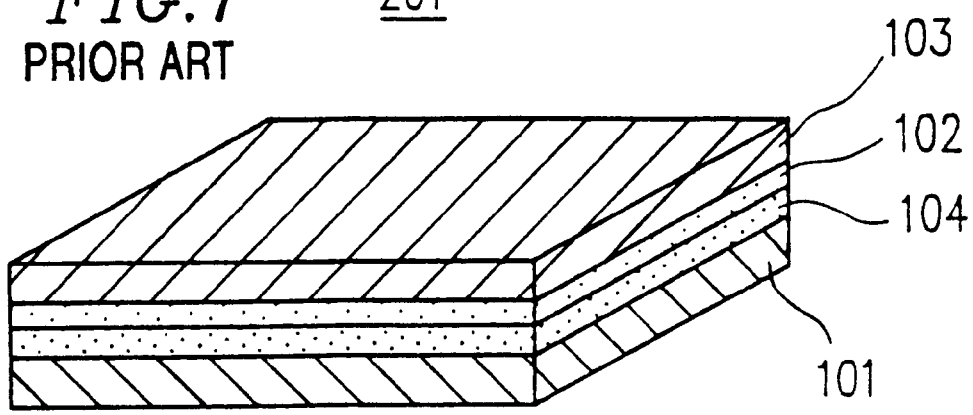
FIG. 1 is a view showing a construction of a conventional optical isolator.
Figure 2:
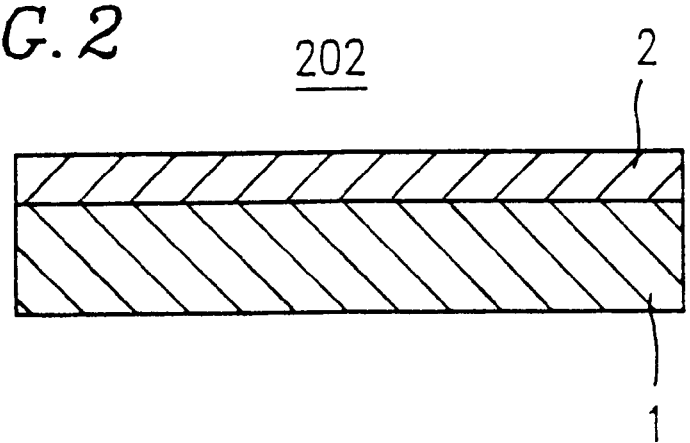
FIG. 2 is a cross-sectional view of a hybrid magnetic substrate of Example 1 according to the present invention.

FIG. 2 shows a cross-sectional view of a hybrid magnetic substrate 202 of Example 1 according to the present invention. The hybrid magnetic substrate 202 has a holding substrate 1 and a magnetic substrate 2 which are bonded to each other through direct bonding.

In the present specification, a bond formed by hydrogen bonds or covalent bonds without using an adhesive is referred to as "direct bonding". In the direct bonding, hydrogen bonds and covalent bonds may be formed together. Depending upon the materials used for the substrates, an ion bond can work for bonding the holding substrate 1 to the magnetic substrate 2. The substrates are bonded to each other through direct bonding at an atomic level, and particular elements other than hydrogen, oxygen, and elements forming the substrates are not present on a bonding interface.

Figure 3A:
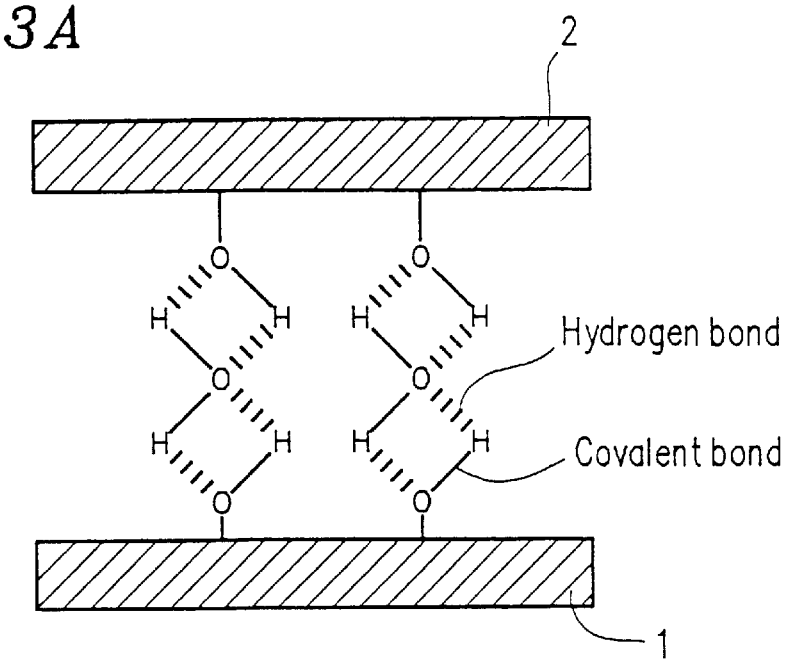
FIGS. 3A through 3C are views schematically showing the principle of direct bonding.
Figure 3B:
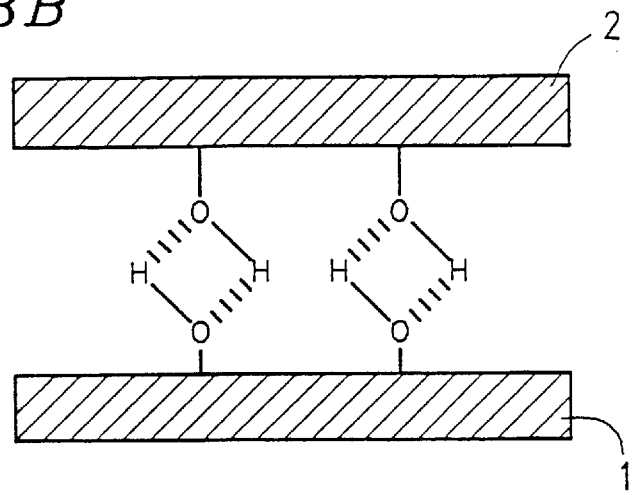
Figure 3C:
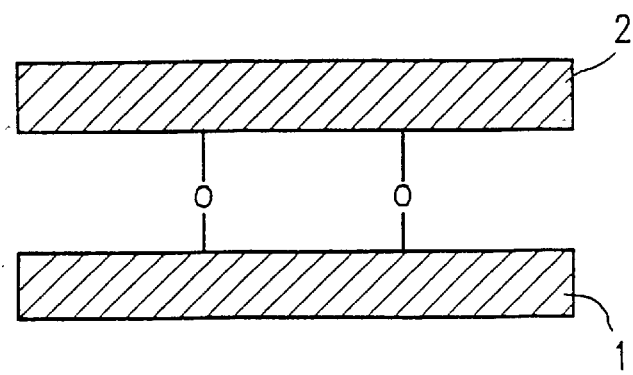

The direct bonding will be described with reference to FIGS. 3A through 3C.

First, the surfaces of the substrates 1 and 2 are cleaned, subjected to a hydrophilic treatment, and then dipped into pure water. A number of water molecules and hydroxyl groups are adsorbed to the surfaces of the substrates 1 and 2. Under this condition, the substrates 1 and 2 are attached to each other. An initial bond is conducted therebetween through hydrogen bonds via the water molecules and the hydroxyl groups. FIG. 3A schematically shows this state as a representative example.

The substrates 1 and 2 bonded to each other are heated under this condition. In the meantime, water or hydrogen are released from the bonding interface, whereby the bond between the substrates 1 and 2 are strengthened. The reason why the bond between the substrates 1 and 2 is strengthened is that hydrogen bonds via water molecules are changed to hydrogen bonds via hydroxyl groups. FIG. 3B schematically shows this state as a representative example. This state can be seen most in the case where the bonded substrates 1 and 2 are heat-treated at a temperature in the range of 200° C. to 500° C.

When the temperature for heat treatment is raised, the hydroxyl groups are further condensed and hydrogen is further released. As a result, the covalent bonds via oxygen mainly contribute to the direct bonding to strengthen the bond between the substrates 1 and 2. FIG. 3C shows this state. In the case where silicon is present on the bonding interface, it also promotes the formation of the covalent bonds to strengthen the bond between the substrates 1 and 2. FIGS. 3A through 3C schematically show the representative cases, respectively. It is noted that these states are subject to the elements forming the substrates 1 and 2 and the surface states thereof.

Hereinafter, the difference between the bond using an adhesive such as an organic substance and the direct bonding of the present example, and effects obtained by producing a hybrid magnetic substrate through the direct bonding will be described.

In the case of the bond using an adhesive, a layer of the adhesive always remains on the bonding interface. The thickness of the layer of the adhesive is generally about several μm. In the present example, the thickness of a layer of hydroxyl groups adhering to the substrates by the hydrophilic treatment generally corresponds to about one molecule, so that the distance between the directly bonded substrates is considered to correspond to about several molecules to several atoms. The observation of the bonding interface by a transmission electron microscope (TEM) showed that the thickness of the direct-bonding interface layers were generally about 10 nm or less. It is considered that the direct-bonding interface layer observed by the TEM includes a hydroxyl group layer on the surfaces of the substrates 1 and 2 and a layer of atoms forming the substrates 1 and 2 which participate in the direct bonding and which are in a state different from a bulk state. In the present specification, the layer which is formed on the bonding interface and is in a state different from a bulk state is referred to as an interface layer. Accordingly, the direct bonding enables the bond between the substrates 1 and 2 with the interface layer having a thickness of 20 nm or less. This results in satisfactorily parallel relationship between the substrates 1 and 2. In the case of using an adhesive, irrespective of the kind of the adhesive, i.e., organic adhesives and inorganic adhesives such as glass and cement, the thickness of the layer of the adhesive cannot be controlled in the order of an atomic level.

As described above, in the hybrid magnetic substrate of the present example, the holding substrate and the magnetic substrate are positioned in a satisfactorily parallel with each other, so that the fine processing of the surface of the hybrid magnetic substrate can be performed with high precision. For example, in the case where a magnetostatic wave device is produced, a fine interdigital electrode is required to be formed on the surface of the hybrid magnetic substrate. The width of the interdigital electrode should have a precision at a submicron level. Such a interdigital electrode is generally produced by forming an electrode by vacuum deposition and forming a mask by photolithography, followed by etching. In the case where photolithography at a submicron level is performed, when the holding substrate and magnetic substrate are not sufficiently parallel with each other, the substrates are not exposed to light with good precision, making it impossible to obtain satisfactory processing precision.

In fine processing steps such as a wet etching step and a dry etching step, in some cases, the hybrid magnetic substrate is exposed to acid and various kinds of gases as an etchant and to high temperature. The hybrid magnetic substrates produced by using various kinds of adhesives have problems in the chemical resistance and thermal stability of the adhesives. On the other hand, in the hybrid magnetic substrate obtained by direct bonding of the present example, other materials are not used for bonding. Therefore, the chemical resistance and thermal stability of the hybrid magnetic substrate is determined by those of the materials for forming the hybrid magnetic substrate. In general, the materials for the hybrid magnetic substrate have chemical resistance and thermal stability superior to those of adhesives, so that the materials for the hybrid magnetic substrate are not likely to be deteriorated during the above-mentioned fine processing steps.

In particular, organic adhesives cannot be maintained in a stable state at higher temperatures. Such being the case, if the organic adhesives are used for bonding, the adhesives are thermally deteriorated during the heating steps such as soldering and reflow soldering conducted at about 230° C. in the course of the production of a device using the hybrid magnetic substrate. Furthermore, in magnetic devices, e.g., magnetostatic wave devices utilizing the characteristics of the substrate surface, the characteristics of the devices are deteriorated by gas generated from the adhesives during the heating steps.

According to the present example, the direct bonding will have a strength of tens of $Kg/cm^2$ by heat treatment at 200° C. for about one hour. In the case where reflow soldering is conducted at about 230° C. in the course of the production of the device, bonding with high reliability can be obtained by heat treatment for the direct bonding at 230° C. or higher. The direct bonding does not use an adhesive, so that the heat treatment temperature for the direct bonding depends upon only the materials for forming the hybrid magnetic substrate. The materials used for the hybrid magnetic substrate have excellent heat-resistance; therefore, the hybrid magnetic substrate will not be deteriorated during the heating steps in the course of the production of the device. Thus, highly reliable bonding can be formed by performing the heat treatment for the direct bonding at a temperature used for the heating steps. Furthermore, other materials are not present on the bonding interface, so that gas is not generated, which adversely affects the characteristics of the device during the heating steps in the course of the production of the device. It should be noted that, depending upon the use of the hybrid magnetic substrate, the direct bonding of the present example has strength sufficient for practical uses, even though the heat treatment for strengthening the direct bonding is not performed.

In the direct bonding of the present example, there is no limit to the combination of the holding substrate and the magnetic substrate as in epitaxial growth; therefore, the combination of substrates made of materials having different elements, crystal structures, crystal orientations, and lattice constants is made possible. This results in a remarkably high degree of freedom of the combination of the materials for the holding substrate and the magnetic substrate constituting the hybrid magnetic substrate.

EXAMPLE 2

Hybrid magnetic substrates obtained by using the direct bonding can be used for various devices. In the present example, an optical isolator is produced by using the hybrid magnetic substrate.

Figure 4:
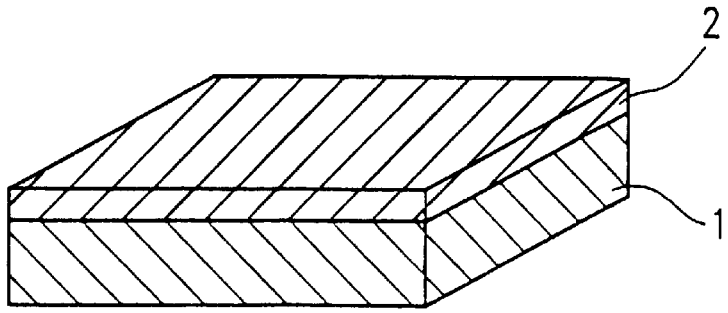
FIG. 4 is a view showing a construction of an optical isolator of Example 2 according to the present invention.

An optical isolator 203 shown in FIG. 4 has a holding substrate 1 made of a magnetic substance such as a GGG single crystal and a YIG substrate 2 as a magnetic substrate. The holding substrate 1 is bonded to the YIG substrate 2 through direct bonding. YIG which is a ferrimagnetic material has a light transmitting property and a large Faraday effect. Thus, a hybrid magnetic substrate using a YIG substrate as an optical waveguide, provided with a polarizer (not shown) on the light incident side of the optical waveguide and with an analyzer (not shown) on the light outputting side thereof, works as the optical isolator 203.

Figure 5:
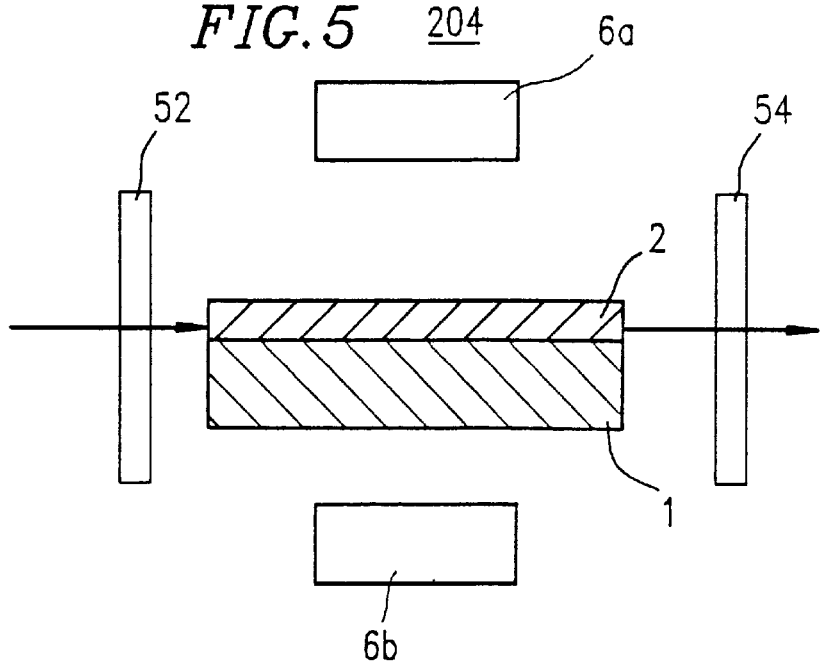
FIG. 5 is a view showing a construction of another optical isolator of Example 2 according to the present invention.

FIG. 5 shows the construction of the optical isolator 204 utilizing the hybrid magnetic substrate and an external magnetic field. A linearly polarized light passed through a polarizer 52 is transmitted through the YIG substrate 2. The YIG substrate 2 is applied with an external magnetic field by permanent magnets 6a and 6b. The length of the YIG substrate 2 and the intensity of the external magnetic field are regulated so that the polarization plane of the linearly polarized light is rotated by 45 degrees by the Faraday effect while propagating through the YIG substrate 2. In order for the polarization plane of the linearly polarized light to allow the light rotated by 45 degrees to pass therethrough, the analyzer 54 is provided so that its polarization axis forms an angle of 45 degrees with the polarization axis of the polarizer 52. Light reflected after passing through the analyzer 54 has its polarization plane rotated by 45 degrees while propagating the YIG substrate 2, and the polarization plane becomes perpendicular to the polarization axis of the polarizer 52. Thus, the reflected light cannot pass through the polarizer 52. Therefore, the optical isolator 204 allows light to pass therethrough only in a direction indicated by an arrow in FIG. 5. Here, it is noted that an optical isolator utilizing a Cotton-Mouton effect can be produced by applying an external magnetic field in a direction parallel with a light propagating direction. Known methods can be used for applying an external magnetic field.

In the constructions of FIGS. 4 or 5, since the refractive index of YIG (i.e., 2.22) is higher than that of GGG, light can be confined in the YIG substrate 2 by setting the thickness of the YIG substrate 2 to be a value appropriate for transmission in a single mode, e.g., about 5 μm. The YIG substrate 2 works as a so-called slab-type optical waveguide.

Figure 6:
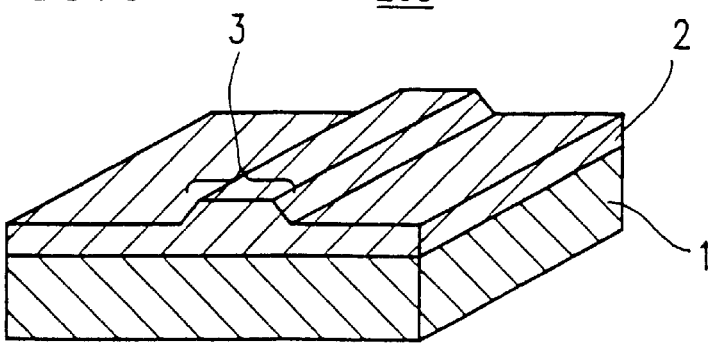
FIG. 6 is a view showing a construction of another optical isolator of Example 2 according to the present invention.

Another optical isolator can be produced by using the hybrid magnetic substrate according to the present invention. FIG. 6 shows a channel type optical waveguide optical isolator 205 (in this figure, a polarizer and an analyzer are not shown). The channel type optical waveguide optical isolator 205 has a GGG holding substrate 1 and a YIG magnetic substrate 2 which are directly bonded to each other. The YIG magnetic substrate 2 has a mount portion 3. Because of this construction, light is confined in the mount portion 3, and the mount portion 3 works as a channel type optical waveguide.

EXAMPLE 3

In the present example, a magnetostatic wave device is produced by using the hybrid magnetic substrate according to the present invention.

Figure 7:
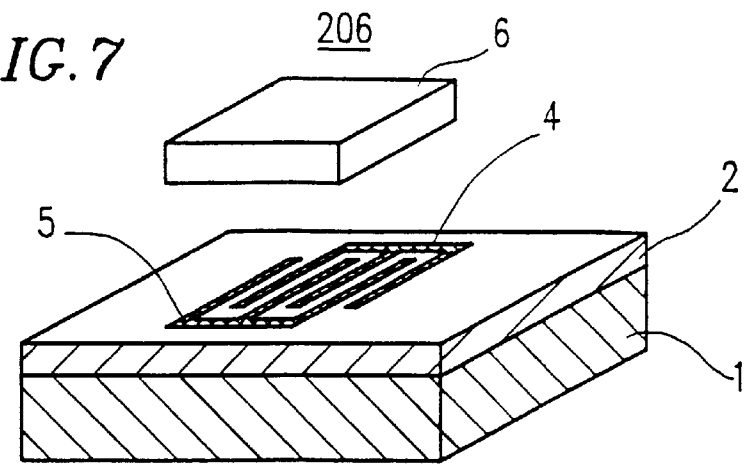
FIG. 7 is a view showing a construction of a magnetostatic wave device of Example 3 according to the present invention.

A magnetostatic wave device 206 shown in FIG. 7 has a GGG single crystalline substrate 1 as a holding substrate and a YIG single crystalline substrate 2 as a magnetic substrate. The GGG single crystalline substrate 1 is bonded to the YIG single crystalline substrate 2 through direct bonding as described in Example 1. Interdigital electrodes 4 and 5 for applying a high-frequency electric field are formed on the YIG single crystalline substrate 2. A magnet 6 for applying an external magnetic field to the YIG single crystalline substrate 2 is provided above the interdigital electrodes 4 and 5. When a high-frequency electric field is applied to the YIG single crystalline substrate 2 under the condition that the YIG single crystalline substrate 2 is applied with a magnetic field, a magnetostatic wave is excited in and propagated through the YIG single crystalline substrate 2. The magnetostatic wave has properties similar to those of a surface elastic wave excited on a piezoelectric substrate, so that the magnetostatic wave device can be used as a filter and a resonator in the same way as in a surface elastic wave device.

The hybrid magnetic substrate used in the magnetostatic wave device 206 of the present example is produced by using the direct bonding. Therefore, the holding substrate and the magnetic substrate have a satisfactorily parallel relationship with each other. This makes it possible to form the interdigital electrodes 4 and 5 on the surface of the YIG single crystalline substrate 2 by minute processing with precision at a submicron level. The processing precision of the interdigital electrodes 4 and 5 greatly affects the characteristics of the device (e.g., resonance frequency, loss). Thus, the magnetostatic wave device 206 provided with the interdigital electrodes 4 and 5 with high precision has satisfactory characteristics. Furthermore, the magnetostatic wave device 206 is produced without using an adhesive, so that the device also has excellent reliability, such as heat resistance.

EXAMPLE 4

Figure 8:
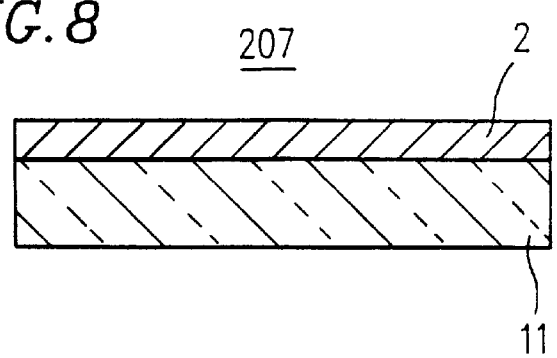
FIG. 8 is a cross-sectional view of a hybrid magnetic substrate of Example 4 according to the present invention.

FIG. 8 shows the construction of another hybrid magnetic substrate 207 according to the present invention. In the present example, a glass substrate 11 is used as a holding substrate, and a YIG single crystalline substrate 2 is used as a magnetic substrate. The glass substrate 11 and the YIG single crystalline substrate 2 are bonded to each other through direct bonding in the same way as in Example 1. In the case where quartz glass is used as a material for the glass substrate 11, the refractive index of quartz glass (i.e., about 1.5) is smaller than that of YIG, so that light can be confined in the YIG substrate 2. Thus, an optical isolator can be obtained in the same way as in Example 2 by providing a polarizer and an analyzer (not shown). Furthermore, a magnetostatic wave device can be obtained by utilizing the construction of Example 3 shown in FIG. 7.

EXAMPLE 5

Figure 9:
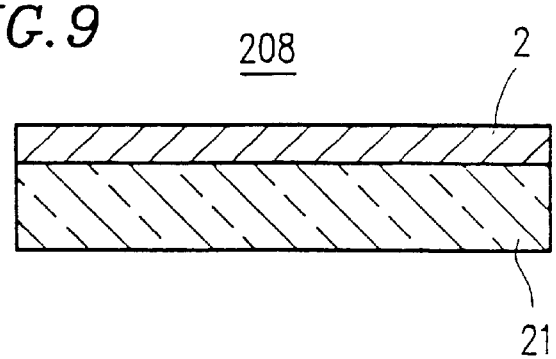
FIG. 9 is a cross-sectional view of a hybrid magnetic substrate of Example 5 according to the present invention.

FIG. 9 shows the construction of another hybrid magnetic substrate 208 according to the present invention. In the present example, a semiconductor substrate 21 made of, for example, Si is used as a holding substrate, and a YIG single crystalline substrate 2 is used as a magnetic substrate. The semiconductor substrate 21 and the YIG single crystalline substrate 2 are bonded to each other through direct bonding in the same way as in Example 1. The hybrid magnetic substrate 208 can be used for producing a magnetostatic wave device by utilizing the construction of Example 3 shown in FIG. 7.

Figure 10:
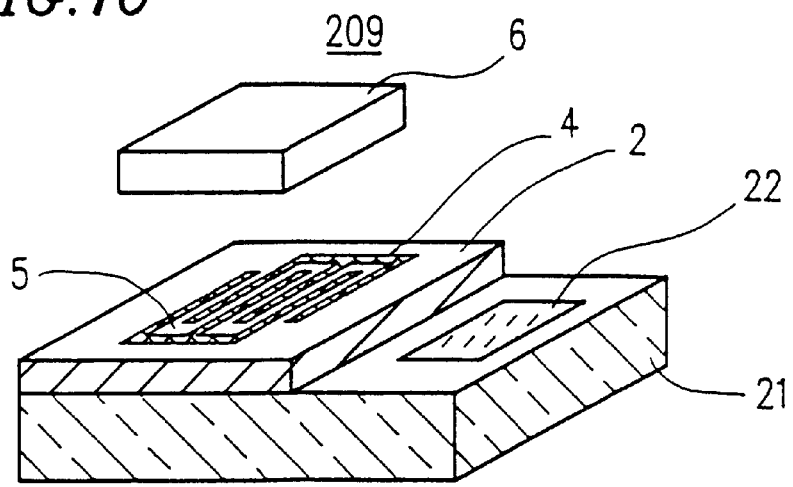
FIG. 10 is a view showing a construction of an integrated magnetic device of Example 5 according to the present invention.

FIG. 10 shows the construction of an integrated magnetic device 209, as an application of the present example, in which a magnetic device and an electronic element are integrated. A magnetostatic wave device portion of the integrated magnetic device 209 has an Si substrate 21, a YIG substrate 2, interdigital electrodes 4 and 5, and a permanent magnet 6, all of which work in the same way as in the magnetostatic wave device of Example 3. The integrated magnetic device 209 further has an electronic circuit portion 22 on the Si substrate 21. An electronic circuit for applying a high-frequency electric field to the interdigital electrodes 4 and 5 is formed on the electronic circuit portion 22 and the interdigital electrodes 4 and 5 are electrically connected to each other, whereby the magnetic device and the electronic element can be integrated. The electric connection (not shown) between the electronic circuit portion 22 and the interdigital electrodes 4 and 5 is performed by various methods such as wire bonding. Alternatively, the electronic circuit portion 22 is connected to the interdigital electrodes 4 and 5 through a wiring formed on the Si substrate 21.

Furthermore, an oscillating circuit is formed on the electronic circuit portion 22 on the Si substrate 21 and a resonator is formed on the YIG substrate 2, whereby an oscillator oscillating at a resonance frequency of the resonator can be constructed. As described above, by using the hybrid magnetic substrate obtained by directly bonding the semiconductor substrate to the magnetic substrate, an integrated magnetic device in which a magnetic device and an electronic element are integrated can be produced.

EXAMPLE 6

Figure 11:
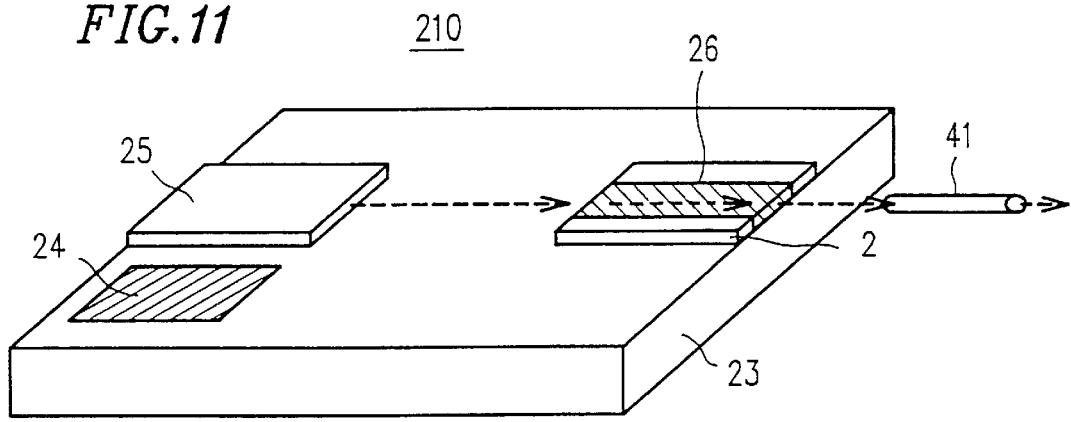
FIG. 11 is a view showing a construction of an integrated magnetic device of Example 6 according to the present invention.

In the present example, a magnetic device has a semiconductor substrate 23 made of a III–V group compound such as GaAs and InP and a YIG substrate 2. On the III–V group compound semiconductor substrate 23, an optical element such as a semiconductor laser and a photodiode are formed so as to be integrated with the magnetic device. In such an integrated magnetic device 210 shown in FIG. 11, the III–V group compound semiconductor substrate 23 and the YIG substrate 2 are bonded to each other through direct bonding. By providing a polarizer and an analyzer (not shown) on the YIG substrate 2, an optical isolator portion 26 is constituted in the same way as in Example 2. Here, it is noted that the polarizer can be omitted if a semiconductor laser emitting a linearly polarized light is used as the optical element. On the III–V group compound semiconductor substrate 23, an electronic circuit portion and an optical element portion are formed. In the present example, a semiconductor laser 25 is formed in the optical element portion and a semiconductor laser driving circuit 24 is formed in the electronic circuit portion (electrical connection thereof is not shown in the figure).

Light emitted from the semiconductor laser 25 controlled by the semiconductor laser driving circuit 24 is transmitted in the air and introduced into the optical isolator portion 26. The light transmitted through the optical isolator portion 26 is output outside and introduced into an optical fiber 41 or the like. The light emitted from the semiconductor laser 25 is output outside through the optical isolator portion 26. Therefore, there is no problem that the output light is reflected to the semiconductor laser to adversely affect laser oscillation. The light is transmitted only in a direction indicated by an arrow in the figure. Thus, in the present example, the optical element, the electronic element, and the magnetic device are integrally formed to miniaturize the entire device and to facilitate optical alignment.

Furthermore, in order to reduce the optical coupling loss between the semiconductor laser 25 and the optical isolator portion 26, the semiconductor laser 25 and the optical isolator portion 26 can be positioned so as to be close to each other, and a layer for aligning the refractive index can be provided between the semiconductor laser 25 and the optical isolator portion 26. Still furthermore, in order to improve light confinement efficiency, a ridge type optical waveguide can be formed on the optical isolator portion 26.

EXAMPLE 7

Figure 12:
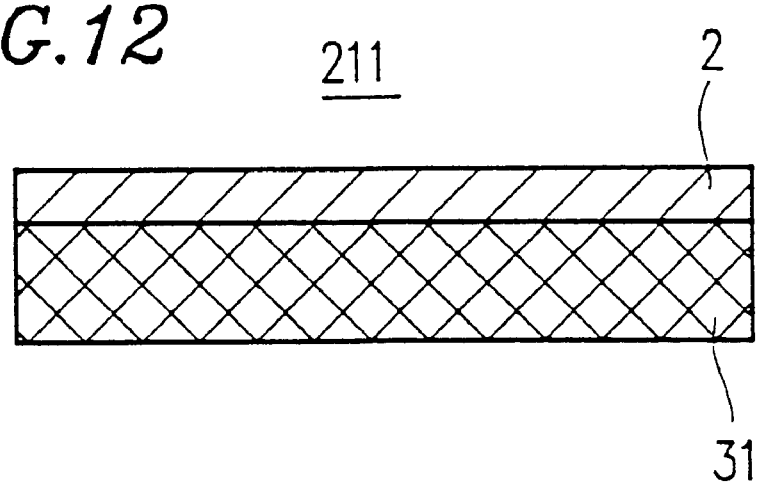
FIG. 12 is a view showing a construction of a hybrid magnetic substrate of Example 7 according to the present invention.

FIG. 12 shows the construction of still another hybrid magnetic substrate 211 according to the present invention. The hybrid magnetic substrate 211 has a light-transmitting substrate having an electro-optic effect as a holding substrate 31 and a YIG single crystalline substrate as a magnetic substrate 2. The holding substrate 31 and the magnetic substrate 2 are bonded to each other through direct bonding in the same way as in Example 1. As a material for the holding substrate 31, lithium niobate, lithium tantalate, and the like can be used.

In the case where the holding substrate 31 having an electro-optic effect made of lithium niobate is used, an optical isolator can be formed by using a material having a refractive index smaller than that of the magnetic substrate 2 for the holding substrate 31 and providing a polarizer and an analyzer in the same way as in Example 2.

In this case, various kinds of optical elements can be formed on the holding substrate 31, so that the optical elements and the optical isolator can be integrally formed.

Figure 13:
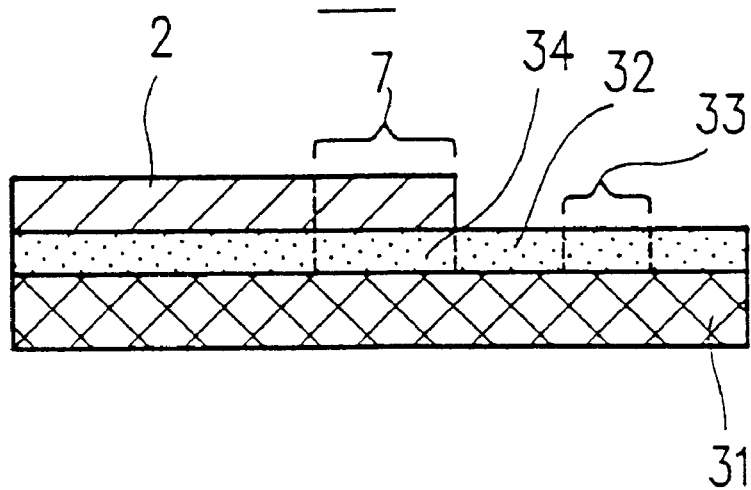
FIG. 13 is a view showing a construction of an integrated magnetic device of Example 7 according to the present invention.

FIG. 13 shows an integrated magnetic device 212 on which optical elements and a magnetic device are integrally formed. As shown in this figure, an optical waveguide layer 32 is formed on the holding substrate 31. The magnetic substrate 2 is bonded to a part of the optical waveguide layer 32 through direct bonding. The optical waveguide layer 32 has optical elements 33 such as a light modulator and a light switch and an optical coupling portion 34 optically coupled with a coupling portion 7 of an optical waveguide of the magnetic substrate 2. The optical coupling in the present example can be performed by various methods. For example, the optical waveguide of the magnetic substrate 2 is optically coupled with the optical waveguide layer 32 by providing light directional couplers in both of the coupling portion 7 and the optical coupling portion 34.

Because of the above-mentioned construction, various kinds of optical elements can be integrated. For example, a device, in which a light modulator and an optical isolator are integrally formed, can be produced. Furthermore, by utilizing the construction of Example 3 shown in FIG. 7, a magnetostatic wave device can be produced.

EXAMPLE 8

Figure 14:
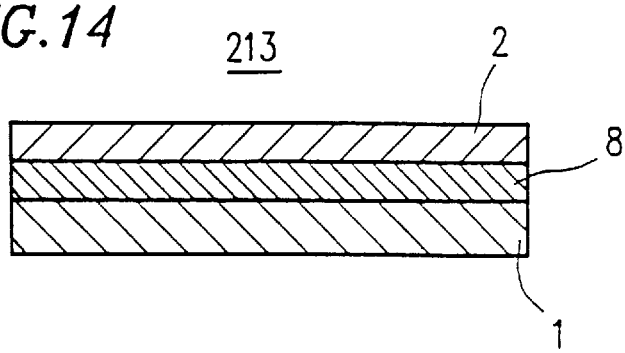
FIG. 14 is a cross-sectional view of a hybrid magnetic substrate of Example 8 according to the present invention.

FIG. 14 shows the construction of still another hybrid magnetic substrate 213 according to the present invention. The hybrid magnetic substrate 213 has a holding substrate 1 (e.g., a GGG magnetic single crystalline substrate), a YIG magnetic single crystalline substrate 2, and an inorganic thin film 8 formed between the holding substrate 1 and the YIG magnetic single crystalline substrate 2. The inorganic thin film 8 is made of, for example, silicon or a silicon compound. The inorganic thin film 8 is formed on the YIG magnetic single crystalline substrate 2 by vacuum deposition, sputtering, chemical vapor deposition (CVD), etc. The YIG magnetic single crystalline substrate 2 is bonded to the holding substrate 1 through direct bonding in the same way as in Example 1 at an interface between the inorganic thin film 8 and the holding substrate 1.

Figure 15:
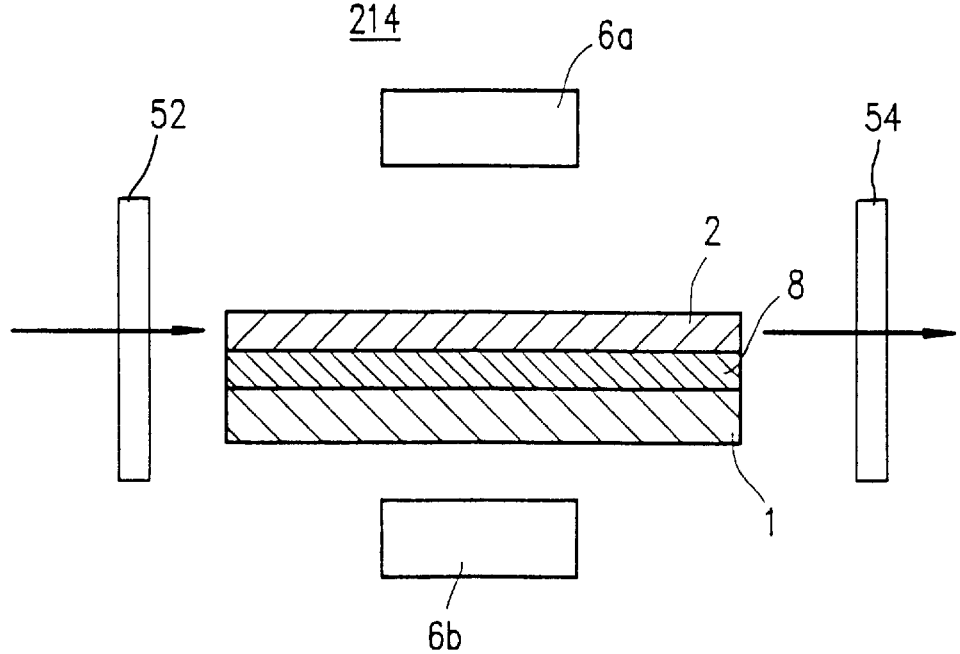
FIG. 15 is a view showing a construction of an optical isolator of Example 8 according to the present invention.

The devices similar to those described in Example 2 or 3 can be produced by appropriately setting the material and the thickness of the inorganic thin film 8. For example, the refractive index of silicon oxide and silicon nitride is in the range of about 1.4 to about 1.5, so that an optical isolator 214 shown in FIG. 15 can be formed in the same way as in Example 2 by using silicon oxide or silicon nitride as a material for the inorganic thin film 8 and appropriately setting the thickness thereof in the range of about 0.1 to 5 $\mu$m. In this case, if the thickness of the inorganic thin film 8 is set to be a wavelength or more of light transmitted therethrough, even though the refractive index of the holding substrate 1 is larger than that of the YIG magnetic single crystalline substrate 2, an optical waveguide can be formed on the YIG magnetic single crystalline substrate 2 and the degree of freedom for combining materials is increased compared with the case where the inorganic thin film 8 is not used.

Figure 16:
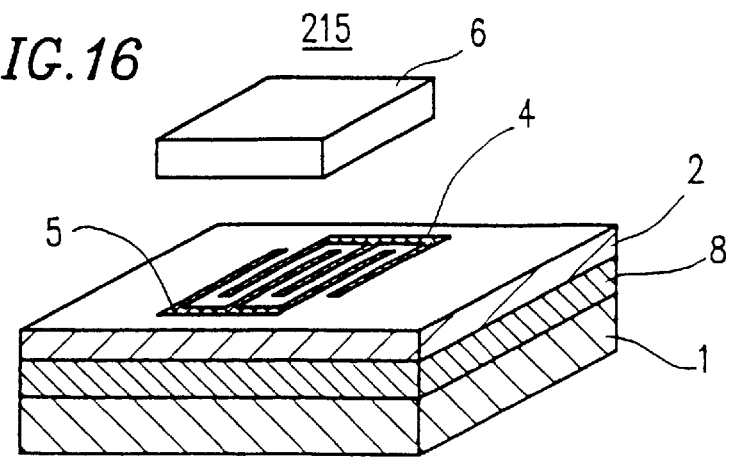
FIG. 16 is a view showing a construction of a magnetostatic wave device of Example 8 according to the present invention.

In the case where the inorganic thin film 8 is formed by vacuum deposition, sputtering, CVD, etc., the thickness thereof can be controlled with good precision. Therefore, a magnetostatic wave device 215 shown in FIG. 16 can be produced using the hybrid magnetic substrate 213 in the same way as in Example 3, which requires a satisfactory parallel relationship between the holding substrate 1 and the YIG magnetic single crystalline substrate 2.

EXAMPLE 9

Figure 17:
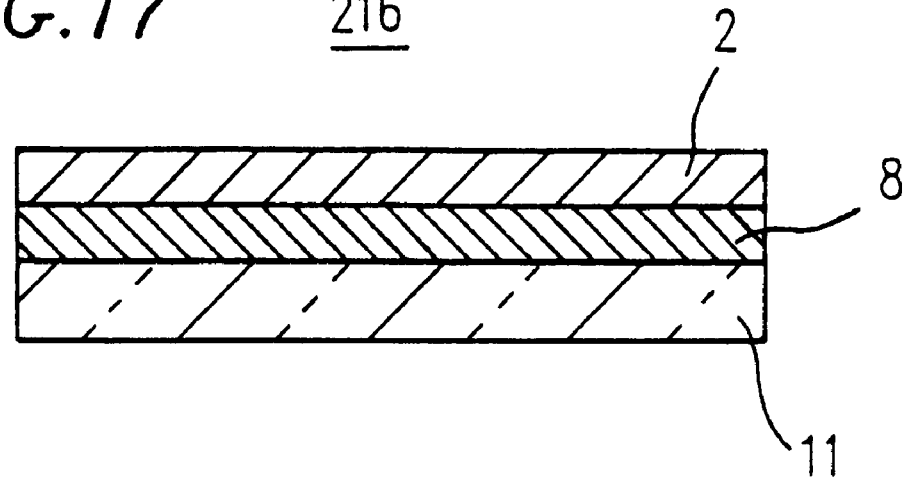
FIG. 17 is a view showing a construction of a hybrid magnetic substrate of Example 9 according to the present invention.

FIG. 17 shows the construction of still another hybrid magnetic substrate 216 according to the present invention. The hybrid magnetic substrate 216 has a holding substrate 11 made of glass, a YIG magnetic single crystalline substrate 2, and an inorganic thin film 8. The inorganic thin film 8 is made of, for example, silicon or a silicon compound such as silicon oxide or silicon nitride. The inorganic thin film 8 is formed on the YIG magnetic single crystalline substrate 2 by vacuum deposition, sputtering, CVD, etc. in the same way as in Example 8. The YIG magnetic single crystalline substrate 2 is bonded to the holding substrate 11 through direct bonding in the same way as in Example 1 at an interface between the inorganic thin film 8 and the holding substrate 11.

Even in the case where quartz glass is used for the holding substrate 11, an optical isolator or a magnetostatic wave device can be produced using the hybrid magnetic substrate 216 by utilizing the construction of Example 8.

EXAMPLE 10

Figure 18:
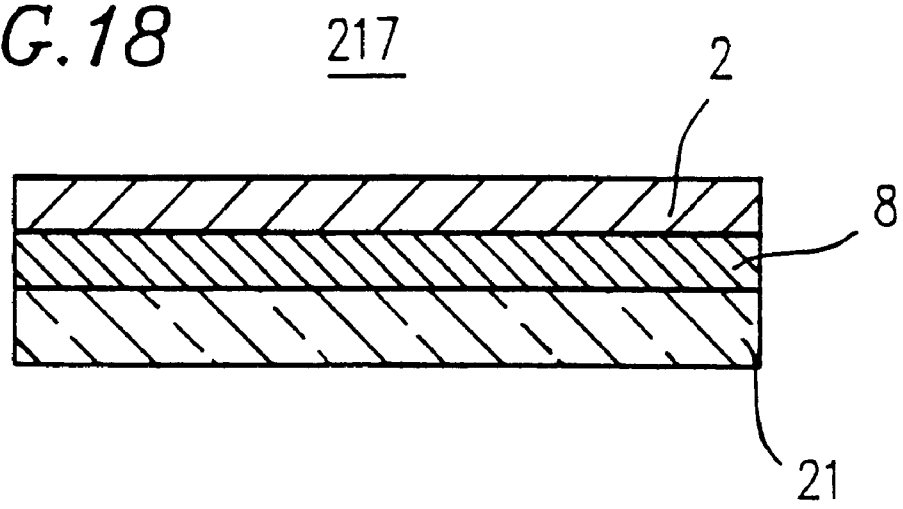
FIG. 18 is a view showing a construction of a hybrid magnetic substrate of Example 10 according to the present invention.

FIG. 18 shows the construction of still another hybrid magnetic substrate 217. The hybrid magnetic substrate 217 has a holding substrate 21 made of a semiconductor such as Si, a YIG magnetic single crystalline substrate 2, and an inorganic thin film 8. The inorganic thin film 8 is made of, for example, silicon or a silicon compound such as silicon oxide or silicon nitride. The inorganic thin film 8 is formed on the YIG magnetic single crystalline substrate 2 by vacuum deposition, sputtering, CVD, etc. The YIG magnetic single crystalline substrate 2 is bonded to the holding substrate 21 through direct bonding in the same way as in Example 1 at an interface between the inorganic thin film 8 and the holding substrate 21.

Even in the case where a semiconductor is used for the holding substrate 21, an optical isolator or a magnetostatic wave device can be produced by utilizing the construction of Example 8.

Furthermore, even when using a semiconductor for the holding substrate 21, an integrated magnetic device can be produced in the same way as in Example 5.

EXAMPLE 11

In the present example, a magnetic device has a substrate 23 made of a III–V group compound such as GaAs and InP and a YIG magnetic single crystalline substrate 2. Optical elements such as a semiconductor laser and a photodiode are formed on the semiconductor substrate 23 so as to be integrated with the magnetic device.

Figure 19A:
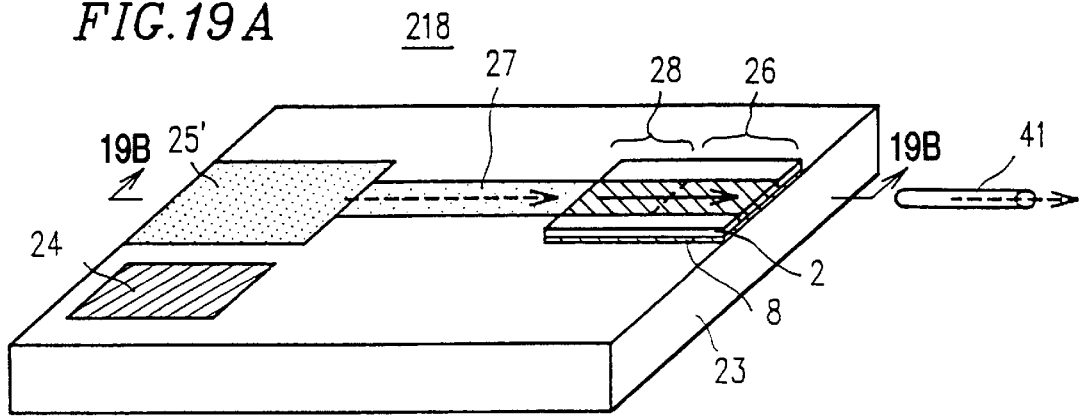
FIG. 19A is a view showing a construction of an integrated magnetic device of Example 11 according to the present invention.
Figure 19B:
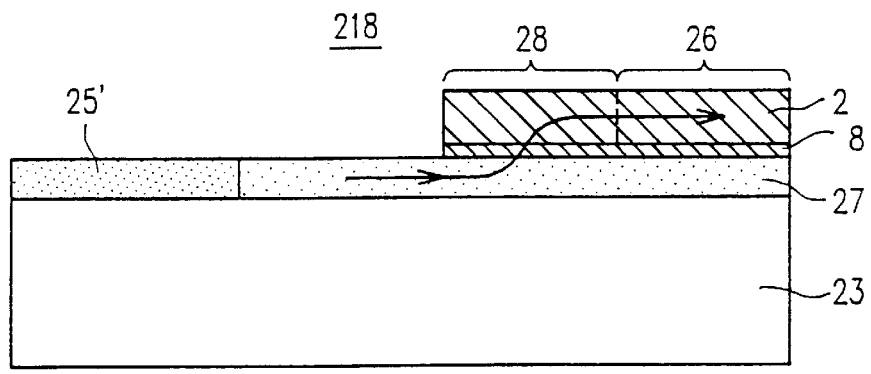
FIG. 19B is a cross-sectional view taken along a line 19B—19B of FIG. 19A.

Hereinafter, an integrated magnetic device 218 with the above-mentioned construction will be described in more detail with reference to FIGS. 19A and 19B. FIGS. 19A and 19B are a perspective view of the integrated magnetic device 218 and a cross-sectional view thereof taken along an 19B—19B line of FIG. 19A, respectively.

The integrated magnetic device 218 has the semiconductor substrate 23 and the YIG magnetic single crystalline substrate 2. In the present example, the semiconductor substrate 23 is bonded to the YIG magnetic single crystalline substrate 2 through direct bonding via an inorganic thin film 8 formed therebetween. On the semiconductor substrate 23, an electronic circuit portion 24 is formed, and a semiconductor laser 25' and an optical waveguide portion 27 are formed in the semiconductor substrate 23. In the electronic circuit portion 24, a semiconductor laser driving circuit is formed (electrical connection thereof is not shown in the figure).

The YIG magnetic single crystalline substrate 2 has an isolator portion 26 and an optical coupling portion 28. By using the semiconductor laser 25 emitting linearly polarized light and providing an analyzer (not shown) on the light outputting side of the YIG magnetic single crystalline substrate 2, the isolator portion 26 works as an isolator. In the case of using the semiconductor laser 25' which does not emit linearly polarized light, a polarizer may be provided on the light emitting side of the semiconductor laser 25' or in an optical path extending from the light emitting side of the semiconductor laser 25' to the optical coupling portion 28.

The operation of the optical coupling portion 28 of the present example will be described with reference to FIG. 19B.

The optical waveguide portion 27 provided in the semiconductor substrate 23 is optically coupled with the YIG magnetic single crystalline substrate 2 working as an optical waveguide by forming a thin film 8 having refractive index smaller than any of those of the semiconductor substrate 23 and the YIG magnetic single crystalline substrate 2. The thickness of the thin film 8 is in the order of microns or less. Light propagating through the optical waveguide portion 27 is introduced into the optical coupling portion 28 after the propagation of a certain distance. The principle of this optical coupling is the same as that of an optical waveguide directional coupler for coupling optical waveguides positioned on the identical plane. The refractive index of III–V group semiconductors such as GaAs and InP and that of a magnetic substance such as YIG are 2 or higher, and the refractive index of a material for the inorganic thin film 8 such as silicon oxide is 1.7 or lower, so that the above-mentioned directional coupler can be produced.

Thus, light emitted from the semiconductor laser 25', controlled by the semiconductor laser driving circuit formed in the electronic circuit portion 24, propagates through the optical waveguide portion 27 as indicated by an arrow in FIGS. 19A and 19B and is introduced into the optical coupling portion 28. Thereafter, the light transmitted through the optical isolator portion 26 is output outside and introduced into an optical fiber 41 or the like.

The present example shows the case where the semiconductor laser 25', the semiconductor laser driving circuit formed in the electronic circuit portion 24, and the optical isolator portion 26 are integrated. Alternatively, a light emitting diode and an amplifier can be formed in place of the semiconductor laser 25' and the semiconductor driving circuit, respectively. These devices can be provided in a plurality of numbers. Furthermore, various kinds of methods can be applied for optical coupling in addition to the above-mentioned method.

As described above, by integrating the electronic element, optical element, and magnetic device, the entire device can be miniaturized and optical alignment is facilitated.

EXAMPLE 12

Figure 20:
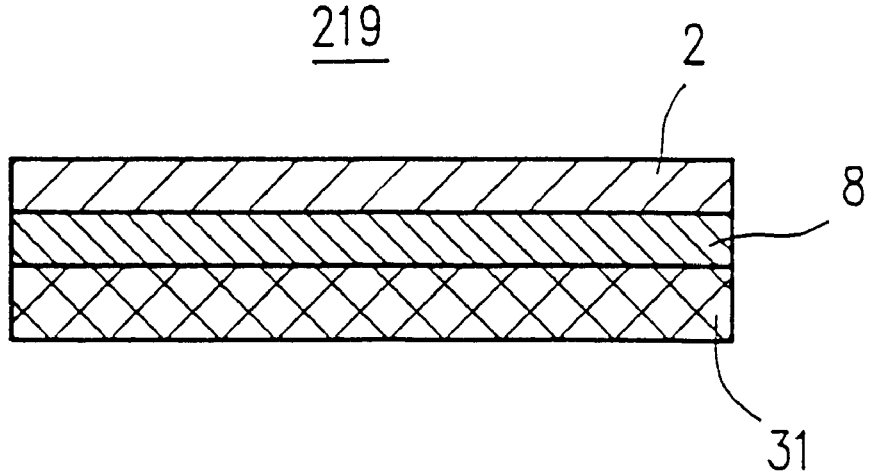
FIG. 20 is a cross-sectional view of a hybrid magnetic substrate of Example 12 according to the present invention.

FIG. 20 shows the construction of still another hybrid magnetic substrate 219 according to the present invention.

The hybrid magnetic substrate 219 has a holding substrate 31, a YIG magnetic single crystalline substrate 2, and an inorganic thin film 8. The holding substrate 31 is made of lithium niobate, lithium tantalate, etc., which allows light to pass therethrough and has an electro-optic effect. The inorganic thin film 8 is made of, for example, silicon or a silicon compound such as silicon oxide or silicon nitride. The inorganic thin film 8 is formed on the YIG magnetic single crystalline substrate 2 by vacuum deposition, sputtering, CVD, etc. in the same way as in Example 8. The YIG magnetic single crystalline substrate 2 is bonded to the holding substrate 31 through direct bonding in the same way as in Example 1 at an interface between the inorganic thin film 8 and the holding substrate 31.

Even in the case where a light-transmitting substrate is used as the holding substrate 31, an optical isolator or a magnetostatic wave device can be produced by utilizing the construction of Example 7.

Furthermore, by using a light-transmitting substrate having an electro-optic effect as the holding substrate 31, an integrated magnetic device can be produced in the same way as in Example 7.

EXAMPLE 13

Figure 21:
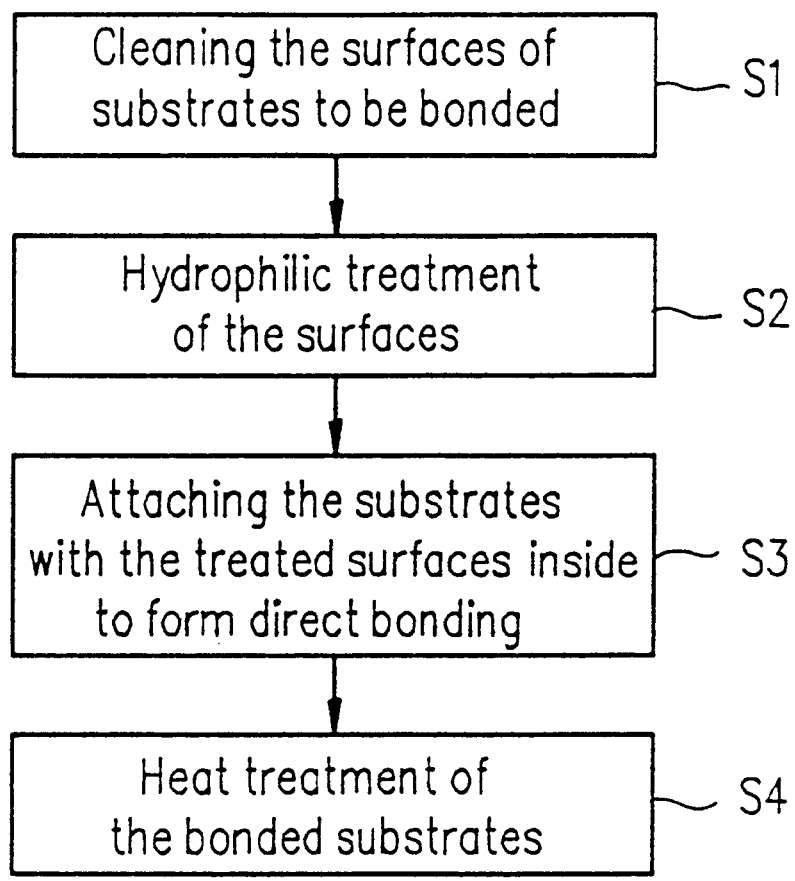
FIG. 21 is a flow chart showing the steps of producing a hybrid magnetic substrate shown in FIG. 2.

A method for producing the hybrid magnetic substrate 202 of Example 1 shown in FIG. 2 will be described with reference to a flow chart of FIG. 21.

First, the surface of the holding substrate and that of the magnetic substrate are flattened by grinding. The grinding is continued until a mirror finish can be obtained on the surfaces. Then, the surfaces to be bonded are cleaned with a detergent and various kinds of solvents (S1). The respective surfaces are subjected to a hydrophilic treatment by using a solution containing ammonia and hydrogen peroxide at a temperature in the range of 60° C. to 70° C. (S2). Thereafter, the surfaces subjected to the hydrophilic treatment are thoroughly washed with pure water. Then, the substrates are attached to each other so that the treated surfaces face each other, whereby the holding substrate is directly bonded to the magnetic substrate (S3). The bonded substrates are heat-treated under this condition to increase the bonding strength (S4). When the bonded substrates are heat-treated at a temperature in the range of 100° C. to 800° C., the bonding strength is further increased. The temperature for heat treatment can be set depending upon the use of the hybrid magnetic substrate 202. It is noted that depending upon the case, the heat treatment step can be omitted.

In the case where the temperature for heat treatment is high, the great difference in thermal expansion coefficient between the holding substrate and the magnetic substrate causes large thermal stress at the bonding interface. In order to reduce the thermal stress, it is required to appropriately determine the configuration of the substrates and the size thereof. When the bonded substrates are heat-treated at higher temperatures, the thermal stress can be reduced by making the thickness and area of the magnetic substrate smaller, and hence the bonding strength can be increased without delamination or damaging the bonding interface. The bonding strength is increased by several times, i.e., the bonding strength of tens of Kg/cm$^2$ can be obtained only by allowing the bonded substrates to be subjected to heat treatment at 200° C. for about one hour. The temperature for heat treatment may be equal to or lower than a temperature at which the holding substrate and the magnetic substrate change in quality.

As described above, substrates made of various kinds of materials can be bonded through direct bonding by appropriately setting a hydrophilic treatment method, a heat treatment temperature, a thermal expansion coefficient of substrates to be bonded, and size of the substrates. The hydrophilic treatment method is not limited to that described above. Alternatively, a known method for introducing hydroxyl groups into the surfaces of the substrates can be used.

In the case where garnet (represented by a general formula: $A_3B_5O_{12}$) such as YIG, materials obtained by partially replacing the constituting element of YIG by bismuth (Bi), materials obtained by partially replacing the constituting element of YIG by a rare-earth element, or ferrite (represented by a general formula: $MO.Fe_2O_3$, M is Mn, Fe, Co, Ni, Zn, Mg, etc.) are used as the magnetic substrate, and magnetic substance such as garnet crystal (e.g., GGG), a material obtained by replacing the constituting element of GGG by another element, and ferrite, glass such as quartz glass and glass borosilicate, semiconductors such as Si, III–V group compound semiconductors such as GaAS or InP, and light-transmitting substances having an electro-optic effect such as lithium niobate or lithium tantalate are used as the holding substrate, the direct bonding can be satisfactorily performed by the above-mentioned production method.

In the case where the magnetic substrate and the holding substrate are made of the identical material or made of materials having almost the same thermal expansion coefficients, the bonded substrates can be heat-treated at higher temperatures, and hence more satisfactory bonding strength can be obtained. Furthermore, in the case where glass is used for the holding substrate, the thermal expansion coefficient thereof can be varied in a wide range, so that glass having a thermal expansion coefficient matched with that of the magnetic substrate to be used can be utilized for the holding substrate.

The substrates to be used for the direct bonding are preferably single crystalline substrates which can easily provide flat and clean surfaces. The reason for this is that the unevenness of the surfaces of the substrates affect the yield of the direct bonding.

According to the present example, the bonding interface can be obtained in the order of an atomic level without using an adhesive, so that a hybrid magnetic substrate stable against the thermal change and mechanical vibration can be produced.

EXAMPLE 14

Figure 22:
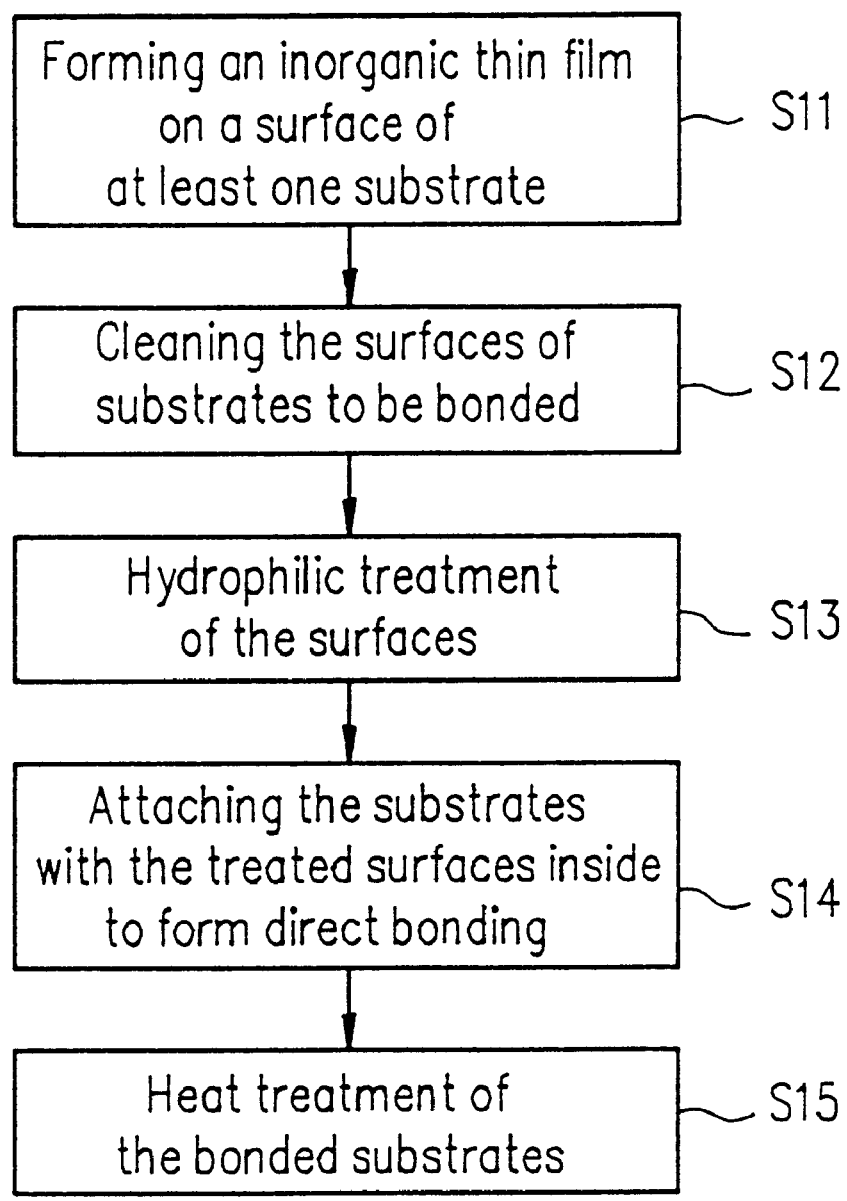
FIG. 22 is a flow chart showing the steps of producing a hybrid magnetic substrate shown in FIG. 14.

A method for producing the hybrid magnetic substrate 213 of Example 8 shown in FIG. 14 will be described with reference to a flow chart of FIG. 22.

First, the surface of the holding substrate and that of the magnetic substrate are flattened by grinding. The grinding is continued until a mirror finish can be obtained on the surfaces. Then, the inorganic thin film is formed on at least one of the substrates to be bonded by sputtering, vacuum deposition, CVD, etc. (S11). As a material for the inorganic thin film, silicon or a silicon compound is preferred. In this case, the silicon may be polycrystalline or amorphous. As the silicon compound, silicon oxide, silicon nitride, etc. are preferred. Then, the surface to be bonded of the substrate on which the inorganic thin film is not formed and the surface of the inorganic thin film are cleaned with a detergent and various kinds of solvents (S12). The respective surfaces are subjected to a hydrophilic treatment by using a solution containing ammonia and hydrogen peroxide at a temperature in the range of 60° C. to 70° C. (S13). Thereafter, the surfaces subjected to the hydrophilic treatment are thoroughly washed with pure water. Then, the substrates are attached to each other so that the treated surfaces face each other, whereby the holding substrate is directly bonded to the magnetic substrate in the same way as in Example 13 (S14). The bonded substrates are heat-treated under this condition to increase the bonding strength (S15). When the bonded substrates are heat-treated at a temperature in the range of 100° C. to 800° C., the bonding strength is further increased. The effects obtained by the heat treatment are almost similar to those of Example 13. The bonding strength is increased by several times, i.e., the bonding strength of tens of Kg/cm$^2$ can be obtained only by allowing the bonded substrates to be subjected to heat treatment at 200° C. for about one hour. The temperature for heat treatment may be equal to or lower than a temperature at which the holding substrate and the magnetic substrate change in quality.

In Example 8, the case where the inorganic thin film is formed on the magnetic substrate is described; however, even though the inorganic thin film is formed on the holding substrate, the direct bonding can be performed in the same way. Furthermore, even though the inorganic thin films are formed on both of the substrates, the direct bonding can be performed in the same way. In any case, the function and performance of the resulting hybrid magnetic substrates are almost the same.

In the direct bonding formed by heat treatment at high temperatures, covalent bonds play a critical part. Therefore, when an inorganic insulating layer containing silicon is used, covalent bonds can be easily formed to increase the bonding strength.

In the case where garnet (represented by a general formula: $A_3B_5O_{12}$) such as YIG, materials obtained by partially replacing the constituting element of YIG by bismuth (Bi), materials obtained by partially replacing the constituting element of YIG by rare-earth element, or ferrite (represented by a general formula: $MO.Fe_2O_3$, M is Mn, Fe, Co, Ni, Zn, Mg, etc.) are used as the magnetic substrate, and a magnetic substance such as garnet crystal (e.g., GGG), a material obtained by replacing the constituting element of GGG by another element, and ferrite, glass such as quartz glass and glass borosilicate, semiconductors such as Si, III–V group compound semiconductors such as GaAs or InP, and light-transmitting substances having an electro-optic effect such as lithium niobate or lithium tantalate are used as the holding substrate, the direct bonding can be satisfactorily performed by the above-mentioned production method.

In the case where the magnetic substrate and the holding substrate are made of the identical material or made of materials having almost the same thermal expansion coefficients, the bonded substrates can be heat-treated at higher temperatures, and hence more satisfactory bonding strength can be obtained. Furthermore, in the case where glass is used for the holding substrate, the thermal expansion coefficient thereof can be varied in a wide range, so that glass having a thermal expansion coefficient matched with that of the magnetic substrate to be used can be utilized for the holding substrate.

The substrates to be used for the direct bonding are preferably single crystalline substrates which can easily provide flat and clean surfaces. The reason for this is that the unevenness of the surfaces of the substrates affect the yield of the direct bonding.

Compared with the method of Example 13, the present example has the following advantages.

The inorganic thin film works as a buffer layer for the stress generated at the interface of the direct bonding, so that the limitation to the difference in thermal expansion coefficient between the magnetic substrate and the holding substrate and the size thereof can be slightly alleviated. Because of this, the bonded substrates can be heat-treated at higher temperatures; as a result, increased bonding strength can be obtained. Furthermore, even when some dust is present on the bonding interface, such dust is taken in the inorganic thin film while the direct bonding is strengthened by the heat treatment. Therefore, the production yield is enhanced. These advantages are remarkably obtained in the case where a material such as silicon oxide having lower rigidity than that of the magnetic single crystalline substrate is used.

According to the present example, the bonding interface can be obtained in the order of an atomic level without using an adhesive, so that a hybrid magnetic substrate stable against the thermal change and mechanical vibration can be produced.

The present example shows the application of the hybrid magnetic substrate to particular devices. However, the present example is not limited thereto and can be applied to other devices such as a magnetic head.

According to the present invention, a hybrid magnetic substrate can be produced without using an adhesive such as an organic substance. This makes it possible to obtain a satisfactory parallel relationship between the bonded substrates and to perform minute processing on the surface of the resulting hybrid magnetic substrate with high precision. In addition, the hybrid magnetic substrate thus obtained by using direct bonding is thermally, mechanically, and chemically stable. Furthermore, the degree of freedom for combining the materials for the holding substrate and the magnetic substrate is high, so that the hybrid magnetic substrate suitable for its purpose can be readily produced. This results in the increase in the degree of freedom for designing an applied magnetic device such as an optical isolator and a magnetostatic wave device. Furthermore, according to the present invention, an integrated magnetic device, in which a magnetic device, electronic elements, and optical elements are integrally formed, can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A hybrid magnetic substrate comprising a magnetic substrate and a holding substrate, wherein an inorganic thin film is formed on a surface of the magnetic substrate, and the holding substrate is in direct contact with a surface of the inorganic thin film by direct-bonding through at least one of the group consisting of a hydrogen bond between hydroxyl groups from water between said substrates remaining from a hydrophilic treatment step, and a covalent bond transformed from the hydrogen bond, said covalent bond including an oxygen atom.

2. A hybrid magnetic substrate according to claim 1, wherein a thickness of a bonding interface layer between the magnetic substrate and the holding substrate directly bonded to each other is 20 nm or less.

3. A hybrid magnetic substrate according to claim 1, wherein a material for the magnetic substrate is a single crystal.

4. A hybrid magnetic substrate according to claim 1, wherein a material for the magnetic substrate is garnet.

5. A hybrid magnetic substrate according to claim 4, wherein a material for the magnetic substrate is mainly yttrium-iron-garnet.

6. A hybrid magnetic substrate according to claim 1, wherein the holding substrate is made of a semiconductor material.

7. A hybrid magnetic substrate according to claim 6, wherein the semiconductor material is silicon.

8. A hybrid magnetic substrate according to claim 7, wherein the semiconductor material is a III–V group semiconductor material.

9. A hybrid magnetic substrate according to claim 1, wherein a material for the holding substrate is glass.

10. A hybrid magnetic substrate according to claim 9, wherein a thermal expansion coefficient of the glass is substantially the same as a thermal expansion coefficient of the magnetic substrate.

11. A hybrid magnetic substrate according to claim 1, wherein the holding substrate is a light-transmitting substrate having an electro-optic effect.

12. A hybrid magnetic substrate according to claim 1, wherein a material for the holding substrate is a magnetic.

13. A hybrid magnetic substrate according to claim 1, wherein a material for the magnetic substrate is the same as a material for the holding substrate.

14. A hybrid magnetic substrate according to claim 1, wherein a material for the inorganic thin film is selected from the group consisting of silicon and a silicon compound.

15. A hybrid magnetic substrate according to claim 14, wherein the silicon compound is a material selected from the group consisting of silicon oxide and silicon nitride.

16. A method for producing a hybrid magnetic substrate having a magnetic substrate and a holding substrate each having a bonding surface, comprising the steps of:
    forming an inorganic thin film on the bonding surface of the magnetic substrate;
    cleaning a surface of the inorganic thin film and the bonding surface of the holding substrate;
    allowing the cleaned surface of the inorganic thin film and the bonding surface of the holding substrate to be subjected to a hydrophilic treatment and allowing water from the hydrophilic treatment to remain on the surfaces following the hydrophilic treatment; and
    attaching the surfaces, which are subjected to the hydrophilic treatment, so that the bonding surface of the holding substrate is in direct contact with the surface of the inorganic thin film by direct-bonding.

17. A method for producing a hybrid magnetic substrate according to claim 16, wherein a material for the inorganic thin film is selected from the group consisting of silicon and a silicon compound.

18. A magnetostatic wave device comprising a hybrid magnetic substrate having a magnetic substrate and a holding substrate, wherein an inorganic thin film is formed on the magnetic substrate, and the holding substrate is direct-bonded with a surface of the inorganic thin film by direct-bonding through at least one of the group consisting of a covalent bond and an ion bond with the atoms forming an interface layer mainly participating in the direct bonding, and additionally a hydrogen bond between hydroxyl groups from water between said substrates remaining from a hydrophilic treatment step, wherein an electrode for exciting a magnetostatic wave is provided on the magnetic substrate.

19. A magnetic device comprising a hybrid magnetic substrate having a magnetic substrate and a holding substrate, wherein an inorganic thin film is formed on the magnetic substrate, and the holding substrate direct-bonded with a surface of the inorganic thin film by direct-bonding through at least one of the group consisting of a covalent bond and an ion bond with the atoms forming an interface layer mainly participating in the direct bonding, and additionally a hydrogen bond between hydroxyl groups from water between said substrates remaining from a hydrophilic treatment step,
    wherein the magnetic substrate has a magneto-optic effect and the magnetic substrate has a function as an optical isolator.

20. A magnetic device comprising a hybrid magnetic substrate having a magnetic substrate and a holding substrate, wherein an inorganic thin film is formed on the magnetic substrate, and the holding substrate direct-bonded with a surface of the inorganic thin film by direct-bonding through at least one of the group consisting of a covalent bond and an ion bond with the atoms forming an interface layer mainly participating in the direct bonding, and additionally a hydrogen bond between hydroxyl groups from water between said substrates remaining from a hydrophilic treatment step,
    wherein the holding substrate is a light-transmitting substrate having an electro-optic effect, and an optical device is formed on the light-transmitting substrate.

21. An integrated magnetic device comprising a hybrid magnetic substrate having a magnetic substrate and a holding substrate, wherein an inorganic thin film is formed on the magnetic substrate, and the holding substrate direct-bonded with a surface of the inorganic thin film by direct-bonding through at least one of the group consisting of a covalent bond and an ion bond with the atoms forming an interface layer mainly participating in the direct bonding, and additionally a hydrogen bond between hydroxyl groups from water between said substrates remaining from a hydrophilic treatment step,
    wherein the holding substrate is made of a semiconductor material and at least one element selected from the group consisting of an electronic element and an optical element is formed on the holding substrate.

22. An optical isolator comprising:
    a magnetic substrate and a holding substrate, wherein an inorganic thin film is formed on a surface of the magnetic substrate, and the holding substrate is in direct contact with a surface of the inorganic thin film by direct-bonding through at least one of the group consisting of a hydrogen bond between hydroxyl groups from water between said substrates remaining from a hydrophilic treatment step, and a covalent bond transformed from the hydrogen bond, said covalent bond including an oxygen atom, said directly bonded magnetic substrate and holding substrate being heat-treated at a temperature in the range of 200° C. to 800° C.;
    an optical waveguide formed in said magnetic substrate, said waveguide having a light transmitting property and operating via the Faraday effect, said waveguide having a light incident side and a light outputting side;
    a polarizer on the light incident side of said waveguide; and
    an analyzer on the light outputting side of said waveguide.

23. The optical isolator according to claim 22, comprising a magnet for applying a magnetic field to said optical waveguide.

24. The optical isolator according to claim 22, wherein the refractive index of said holding substrate is smaller than the refractive index of said magnetic substrate, thereby confining light in said magnetic substrate.

25. The optical isolator according to claim 22, wherein said holding substrate is made of a compound semiconductor material, further comprising an optical element formed on said holding substrate, said optical element optically coupled with the optical isolator.

26. The optical isolator according to claim 22, wherein said holding substrate is made of a material having an electro-optic effect, further comprising an optical element formed on said holding substrate, said optical element optically connected to the optical isolator.

27. A magnetostatic wave device, comprising:

a magnetic substrate and a holding substrate, wherein an inorganic thin film is formed on a surface of the magnetic substrate, and the holding substrate is in direct contact with a surface of the inorganic thin film by direct-bonding through at least one of the group consisting of a hydrogen bond between hydroxyl groups from water between said substrates remaining from a hydrophilic treatment step, and a covalent bond transformed from the hydrogen bond, said covalent bond including an oxygen atom, said directly bonded magnetic substrate and holding substrate being heat-treated at a temperature in the range of 200° C. to 800° C.;

a plurality of interdigital electrodes, for exciting a magnetostatic wave, provided on said magnetic substrate; and a magnet for applying a magnetic field to said magnetic substrate, said magnet being located above said electrodes.

28. The magnetostatic wave device according to claim 27, wherein said holding substrate is made of a semiconductor material, further comprising an electronic element formed on said holding substrate, said electronic element electrically connected to the magnetostatic wave device.

* * * * *